United States Patent
Gu

(10) Patent No.: US 8,664,993 B2
(45) Date of Patent: Mar. 4, 2014

(54) PHASE INTERPOLATOR, MULTI-PHASE INTERPOLATION DEVICE, INTERPOLATED CLOCK GENERATING METHOD AND MULTI-PHASE CLOCK GENERATING METHOD

(71) Applicant: Realtek Semiconductor Corp., Hsinchu (TW)

(72) Inventor: Li-Jun Gu, JiangSu (CN)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 13/646,040

(22) Filed: Oct. 5, 2012

(65) Prior Publication Data

US 2013/0088274 A1   Apr. 11, 2013

(30) Foreign Application Priority Data

Oct. 9, 2011   (CN) .......................... 2011 1 0303531

(51) Int. Cl.
*H03H 11/16*   (2006.01)
(52) U.S. Cl.
USPC .......................................... 327/231; 327/237
(58) Field of Classification Search
None
See application file for complete search history.

(56) References Cited

U.S. PATENT DOCUMENTS

| | | | | |
|---|---|---|---|---|
| 5,864,246 | A * | 1/1999 | Anderson | 327/122 |
| 7,233,173 | B1 * | 6/2007 | Lewicki et al. | 327/57 |
| 7,656,984 | B2 * | 2/2010 | Kim et al. | 375/373 |
| 7,884,660 | B2 * | 2/2011 | Delage et al. | 327/270 |
| 7,928,789 | B2 * | 4/2011 | Freyman et al. | 327/231 |
| 2006/0076997 | A1 * | 4/2006 | Ogasawara | 327/291 |
| 2008/0001644 | A1 * | 1/2008 | Abel et al. | 327/231 |
| 2009/0289683 | A1 * | 11/2009 | Wong | 327/232 |
| 2010/0283525 | A1 * | 11/2010 | Yoshikawa | 327/237 |
| 2011/0068827 | A1 * | 3/2011 | Ali et al. | 327/3 |

* cited by examiner

*Primary Examiner* — Cassandra Cox
(74) *Attorney, Agent, or Firm* — McClure, Qualey & Rodack, LLP

(57) ABSTRACT

A phase interpolator, multi-phase interpolation device, interpolated clock generating method and multi-phase clock generating method is related to a phase interpolator with a differential to single-ended converter, a load circuit, two differential pairs, a current source and at least a switch pair. By using the switch pair to control the current providing for the two differential pairs from the current source, and through regulating the load of the load circuit and/or the reference current of the current source, the intersection of a first signal and a second signal is in the overlap duration between a first input clock and a second input clock, so that uniform multi-phase output clock signal can be interpolated.

14 Claims, 11 Drawing Sheets

PHASE INTERPOLATOR, MULTI-PHASE INTERPOLATION DEVICE, INTERPOLATED CLOCK GENERATING METHOD AND MULTI-PHASE CLOCK GENERATING METHOD

CROSS-REFERENCES TO RELATED APPLICATIONS

This non-provisional application claims priority under 35 U.S.C. §119(a) on Patent Application No. 201110303531.4 filed in China, P.R.C. on 2011 Oct. 9, the entire contents of which are hereby incorporated by reference.

BACKGROUND

1. Technical Field

The disclosure relates to a clock generator and clock generating method, and more particularly, to a phase interpolator, multi-phase interpolation device, interpolated clock generating method and multi-phase clock generating method.

2. Related Art

Phase interpolator has been widely when using two clock sources to generate a multiple of multi-phase clocks.

FIG. 1 is a schematic diagram showing a multi-phase interpolation device 10, while FIG. 2 is a timing diagram of the input clocks c1 and c2 of the multi-phase interpolation device 10 as well as the output clock signals p0~pm thereof.

Please refer to FIGS. 1 and 2, in which multi-phase interpolation device 10 receives two input clocks c1 and c2 and generates m+1 output clock signals p0~pm, wherein in is a positive integer greater than zero.

A time spacing between the two input clocks c1 and c2 is shown as $\Delta$ in the figure, in other words, the input clock c1 and the input clock c2 have the same waveform, but the input clock c1 has a leading phase difference $\Delta$ with respect to the input clock c2. The output clock signal p0 is equivalent to the input clock c1 having a delayed phase difference $\delta$, and the output clock signal pm is equivalent to the input clock c2 having a delayed phase $\delta$. Furthermore, the rest output clock signals p1~p(m−1) are obtained by interpolating the input clocks c1 and c2. Additionally, the output clock signals p0~pm have an equal time spacing between each other. In other words, there is a phase difference $\Delta/m$ between any two adjacent output clock signals. The phase difference $\Delta/m$ indicates a least significant bit (LSB).

How to interpolate uniform multi-phase output clock signals is one of the circuit design emphases for the present multi-phase interpolation device 10.

SUMMARY

Accordingly, an embodiment of the disclosure provides a phase interpolator including a differential to single-ended converter, a load circuit, a first differential pair, a second differential pair, a current source and a switch pair.

The differential to single-ended converter has two input-ends and converts a first signal and a second signal received from the two input-ends into an output clock signal in single-ended form.

The load circuit is coupled to the two input-ends of the differential to single-ended converter.

A first-end of the first differential pair and a first-end of the second differential pair are coupled to the two input-ends of the differential to single-ended converter. A control-end of the first differential pair receives a first input clock in differential form, and a control-end of the second differential pair receives a second input clock in differential form.

The current source generates a reference current corresponding to the frequency of the first input clock.

A first-end of the first switch pair is coupled to a second-end of the first differential pair as well as a second-end of the second differential pair, and a second-end of the switch pair is coupled to the current source. A control-end of the switch pair receives a control signal in differential form.

Another embodiment of the disclosure also provides a multi-phase interpolation device including a multiple of phase interpolators, wherein the output clock signals from the phase interpolators have equal spacing.

Another embodiment of the disclosure provides interpolated clock generating method which includes: using two differential pairs which share a load circuit to respectively receive a first input clock in differential form and a second input clock in differential form; receiving a reference current; generating at least an input current according to the reference current; providing at least an input current based on the control signal in differential form to bias the differential pairs for generating a first signal and a second signal; regulating the load of the load circuit and/or the reference current so that the intersection of the first signal and the second signal is in the overlap duration between the first input clock and the second input, clock; and converting the first signal and the second signal into a output clock signal in single-ended form.

The reference current corresponds to the frequency of the first input clock.

Another embodiment of the disclosure also provides a multi-phase clock generating method which includes: using the interpolated clock generating method to generate a multiple of output clock signals, wherein the output clock signals have equal spacing.

According to the previous description, the phase interpolator, multi-phase interpolation device, interpolated clock generating method and multi-phase clock generating method, use the switch pair to control the bias state of the two differential pairs sharing the load circuit according to a current source, and regulate the load of the load circuit and/or the reference current, thereby the intersection of the first signal and the second signal is in the overlap duration between the first output clock signal and the second output clock signal, so that uniform multi-phase output clock signals can be interpolated without being affected by process and temperature.

BRIEF DESCRIPTION OF THE DRAWINGS

The disclosure will become more fully understood from the detailed description given herein below for illustration only, and thus not limitative of the disclosure, wherein.

DETAILED DESCRIPTION

Figure 3:
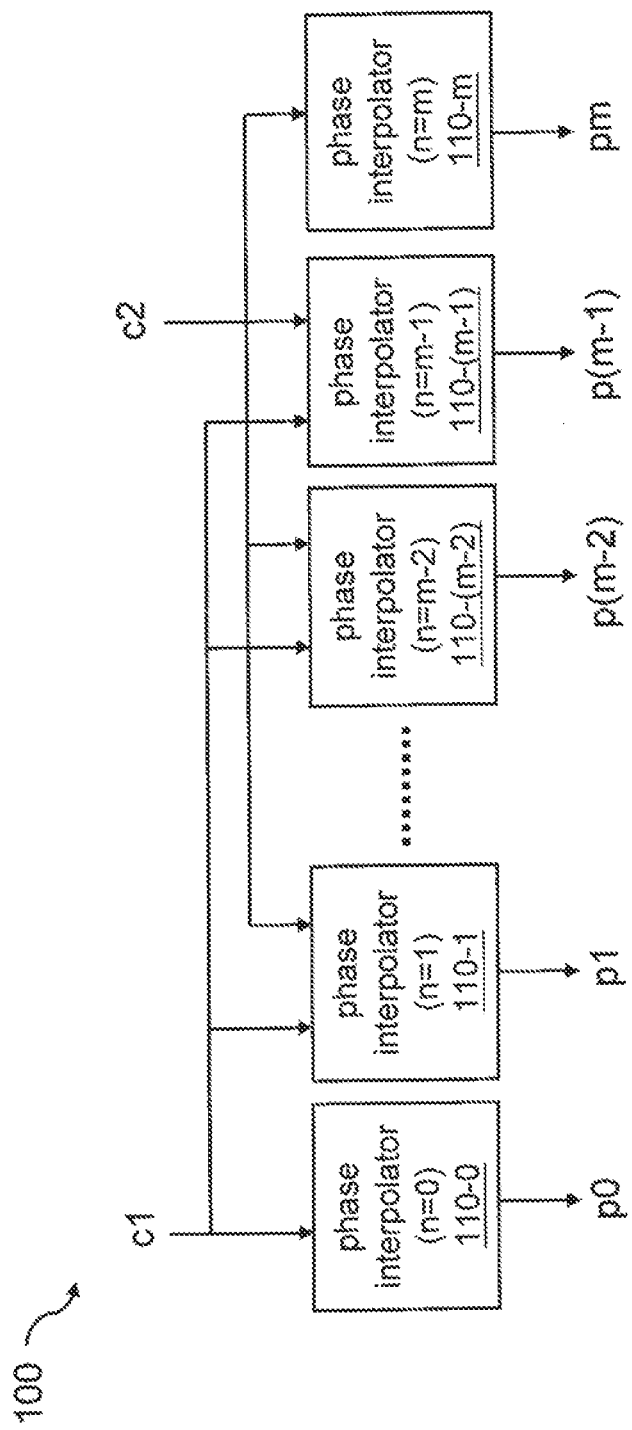
FIG. 3 is a schematic diagram of multi-phase interpolation device according to an embodiment.

FIG. 3 is a schematic diagram of multi-phase interpolation de ice 100 according to an embodiment.

Please refer to FIG. 3, in which multi-phase interpolation device 100 which generates m+1 output clock signals p0~pm, m+1 output clock signals p0~pm are generated by m+1 phase interpolators 110-0~110-m, respectively. For example, assume m=3, then multi-phase interpolation device 100 generates 4 (i.e., 3+1) output clocks p0~p3 through 4 phase interpolators 110-1~110-4.

In FIG. 3, variables n labeled on each phase interpolator means parameterizing settings, wherein n is an integer between 0 and m.

The first phase interpolator (i.e., n=0 or phase interpolator 110-0), and the last phase interpolator (i.e., n=m or phase interpolator 110-m), are applied as a delay element. Namely, phase interpolator 110-0 delays an input clock c1 by a phase difference δ to generate the output clock signal p0, and phase interpolator 110-m delays an input cock c2 by a phase difference δ to generate the output clock signal pm.

The rest of the phase interpolators 110-1~110-(m−1) (i.e., n=1~(m−1)) receive both the input clocks c1 and c2 and interpolate the input clocks c1 and c2 to generate the output clock signals p1~p(m−1), respectively.

Figure 1:
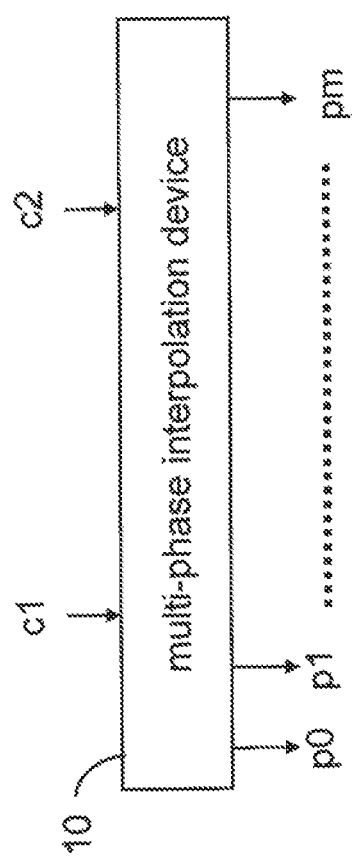
FIG. 1 is a schematic diagram showing a multi-phase interpolation device.
Figure 2:
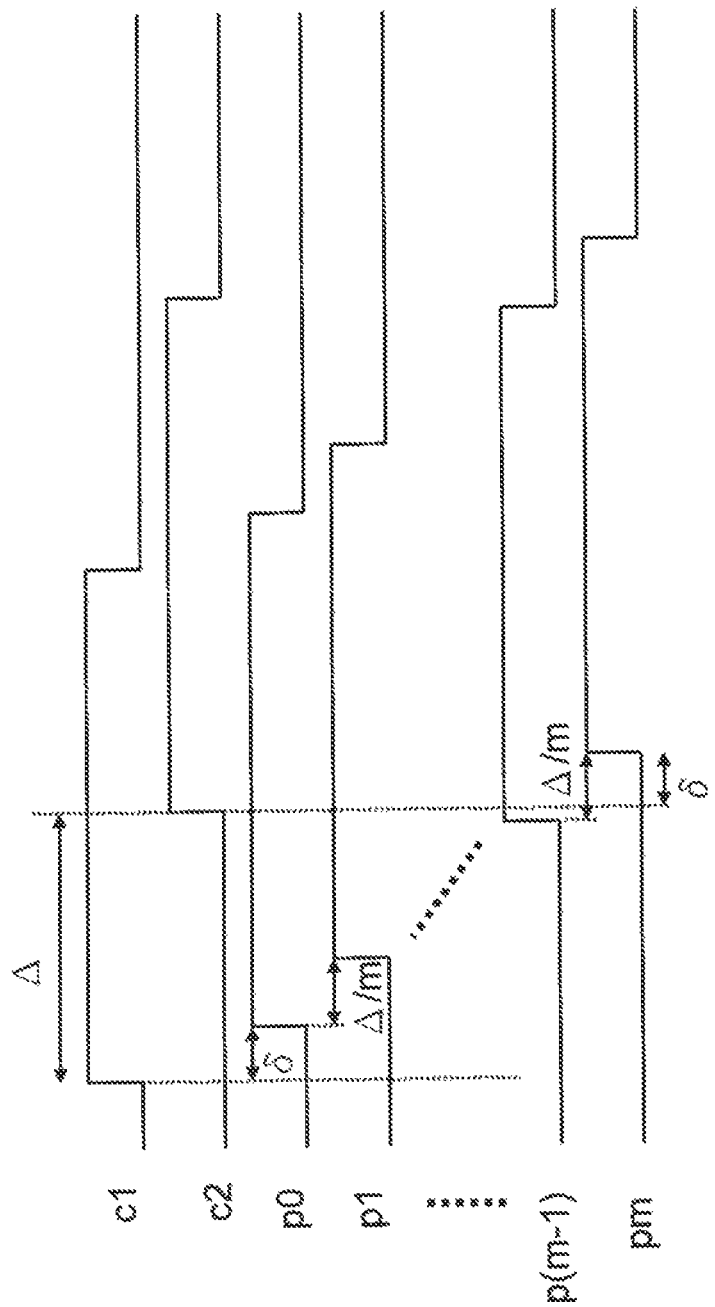
FIG. 2 is a timing diagram of the input clocks of the multi-phase interpolation device as well as the output clock signals thereof.

With regard to the timing show in FIG. 2, the output clock signals p0~pm have the same spacing and the phases thereof are distributed linearly. In other words, multi-phase interpolation device 100 is used to generate the ideal waveform as shown in FIG. 2.

The input clocks c1 and c2 and the output clock signals p0 and pm have equal frequency, and the input clock c1 leads the input clock c2.

Figure 4:
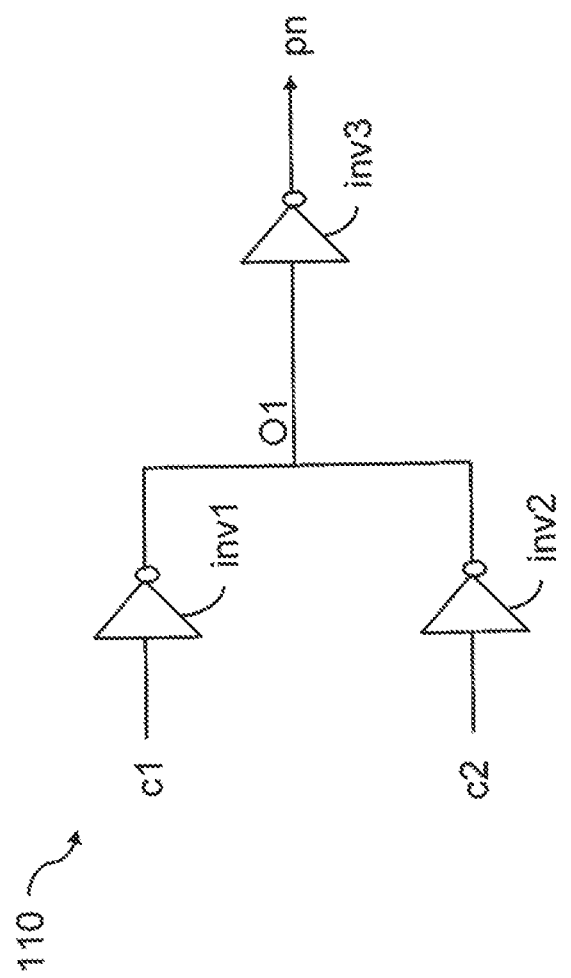
FIG. 4 is a circuit diagram of phase interpolator according to an embodiment.

FIG. 4 is a circuit diagram of phase interpolator 110 according to an embodiment. Phase interpolator 110 is an embodiment of phase interpolators 110-0~110-m shown in FIG. 3; the phase interpolator 110 can be used as a phase interpolator 110 in multi-phase interpolation device 100.

Please refer to FIG. 4, in which the input clocks c1 and c2 are inputted into inverters inv1 and inv2 on first stage, respectively. The output-end of inverters inv1 and inv2 are connected with each other for phase interpolation to generate a phase-interpolation signal O1. The phase of the phase-interpolation signal O1 is determined according to a reference level.

Figure 5:
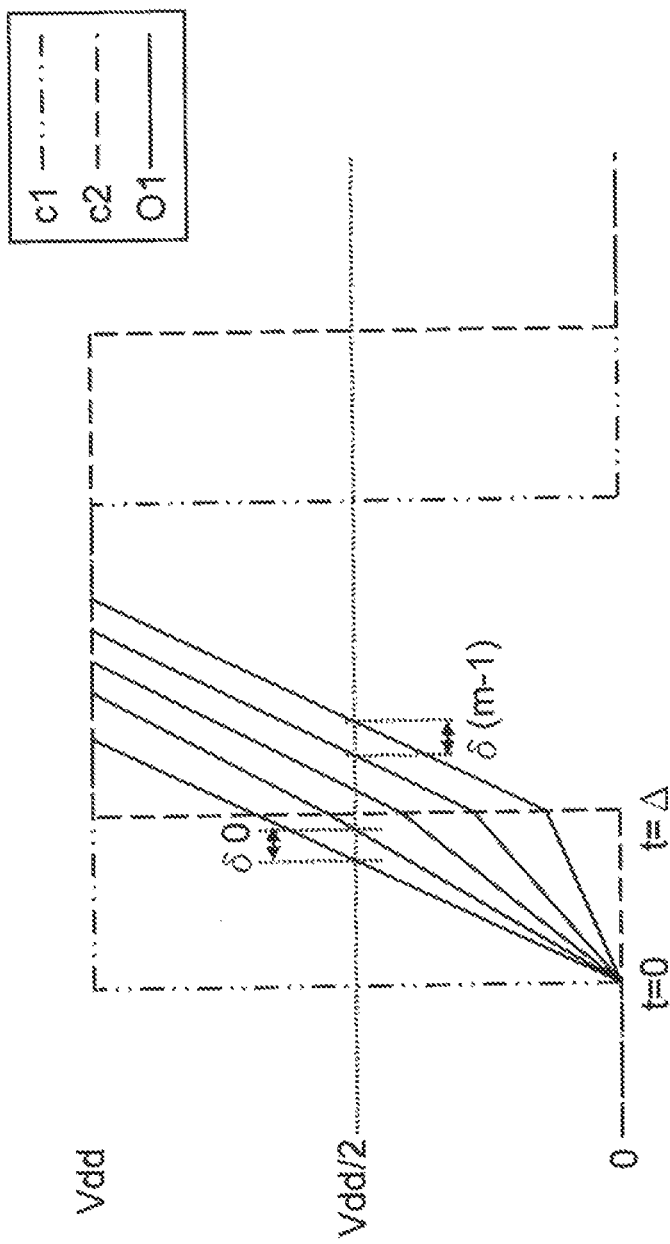
FIG. 5 is a working schematic diagram of phase interpolator.

FIG. 5 is a working schematic diagram of phase interpolator 110.

Please refer to FIG. 5, in which the input clocks c1 and c2 are varied from 0V (Voltage) to Vdd between time t=0 and t=Δ, respectively. The solid lines represent the phase-interpolation signals O1 corresponding to outputs of the clock-phases p0~pm, respectively. Before time t=Δ, the slope of the phase-interpolation signals O1 corresponding to the output clock signals p0~pm are mk~k, respectively. After time t=Δ, the slope of the phase-interpolation signals O1 corresponding to the output clock signals p0~pm are mk.

Assuming that the trigger level of rear stage inverter inv3 is Vdd/2, and Δv represents a voltage difference between the phase-interpolation signals O1 corresponding to the two adjacent output clocks at time t=Δ. Thus, a time spacing δn (i.e., δ0~δ(m−1) as shown in the figure), between the phase-interpolation signals O1 corresponding to the two adjacent output clocks can be calculated by Δv/k, wherein k is a constant.

After processing the phase-interpolation signal O1 through inverter inv3, phase differences between the generated output clock signals p0~pm are apparently not uniform. Although uniform multi-phase output clock signals p0~pm can be obtained by regulating the slope of the phase-interpolation signals O1 corresponding to the output clock signals p0~pm to be unrelated with uniform gradient and by determining certain frequency, process corner and temperature, the variation of the frequency, process corer and temperature will severely influence the uniformity of the output clock signals p0~pm.

Figure 6:
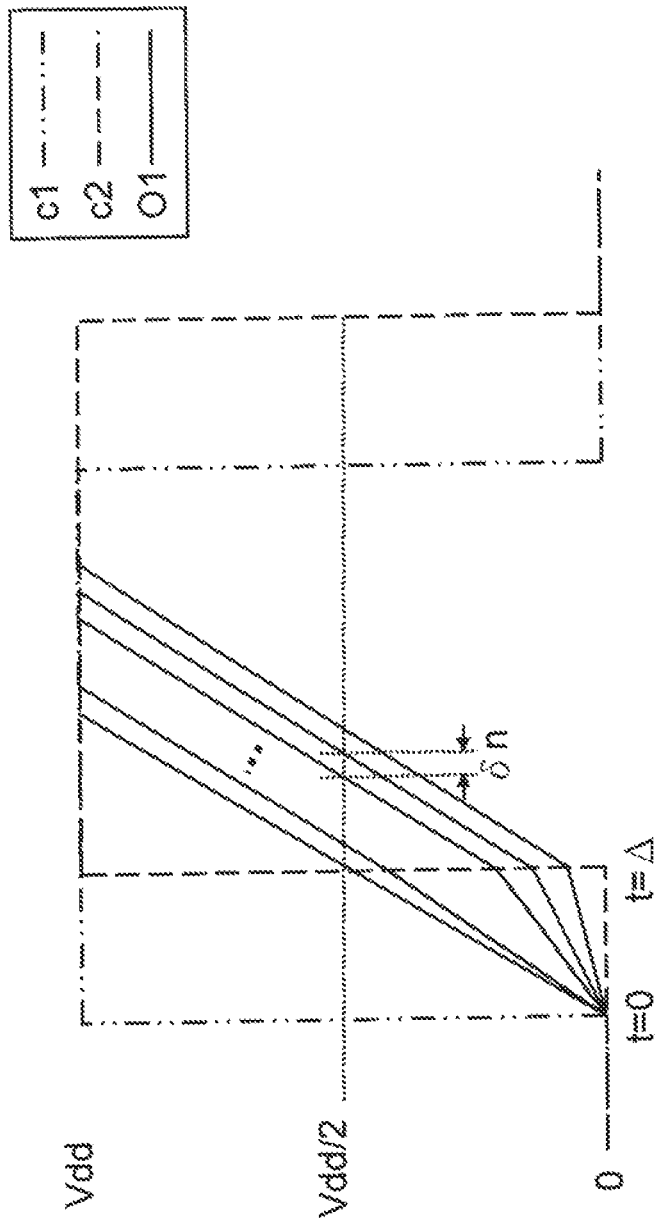
FIG. 6 is a working schematic diagram of phase interpolator according to an embodiment.

FIG. 6 is a working schematic diagram of phase interpolator according to an embodiment.

Please refer to FIG. 6 with reference to the circuit structure shown in FIG. 4, assuming that the trigger level of rear stage inverter inv3 is Vdd/2.

When the intersection of the phase-interpolation signals O1 and Vdd/2 is at the time after t=Δ and the slope of the phase-interpolation signals O1 corresponding to the output clock signals p0~pm are varied according to uniform gradient, the multi-phase output clock signals p0~pm obtained by interpolating the input clocks c1 and c2 are uniform. Thus, when the phase-interpolation signals O1 are differential signals, the intersection of the differential signals must be at the time after t=Δ

Because the intersection of the phase-interpolation signals O1 (slope=mk) corresponding to the output clock signals p0 and Vdd/2 is at the time after t=Δ, the overlap duration between the input clocks c1 and c2 (i.e., the duration in which both the input clocks are high level or low level), must be longer than Δ

For input clocks with 50% duty cycle, the phase difference of the two input clocks is preferably less than 90°, in order to easily interpolate uniform multi-phase output clock signals.

It should be understood that in order to describe the characteristics and/or the interactions of similar components, ordinal numbers (e.g., first, second, third, etc.), are used in this article to distinguish the components, but are not limited to this.

Figure 7:
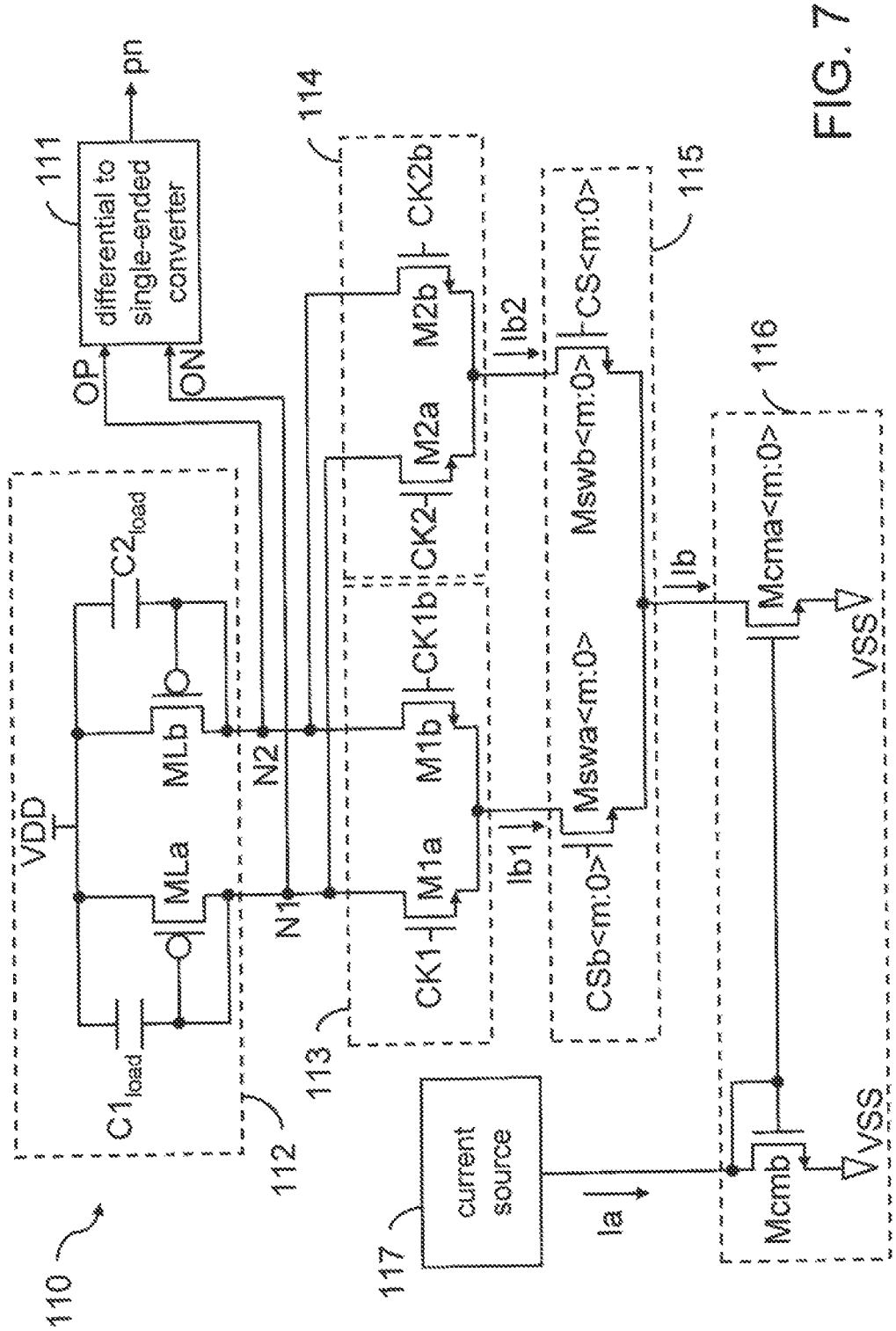
FIG. 7 is a schematic diagram of phase interpolator according to an embodiment.

FIG. 7 is a schematic diagram of phase interpolator 110 according to an embodiment.

Phase interpolator 110 includes differential to single-ended converter 111, load circuit 112, two differential pairs (hereinafter named first signal 113 and second signal 114), at least a switch pair 115 and current source 116/117.

Differential to signal-ended converter 111 has two input-ends and an output-end. The two input-ends of differential to single-ended converter 111 receive a first signal OP and a second signal ON, respectively.

Load circuit 112 is coupled to the two input-ends of differential to single-ended converter 111.

First differential pair 113 has two first-ends, two second-ends and two control-ends. The two first-ends of first differential pair 113 are coupled to the two input-ends of differential to single-ended converter 111, respectively. The two second-ends of first differential pair 113 are coupled with each other.

Second differential pair 114 has two first-ends, two second-ends and two control-ends. The two first-ends of second differential pair 114 are respectively coupled to the two input-ends of differential to single-ended converter 111 to share load circuit 112 with first differential pair 113.

Here, the input-ends of differential to single-ended converter 111, load circuit 112, the first-ends of first differential pair 113 and the first-ends of second differential pair 114 are coupled together at points N1 and N2, in which the points N1 and N2 are the outputs of phase interpolator 110 on first stage. The points N1 and N2 are used to output the first signal OP and the second signal ON, respectively.

Each switch pair 115 has two first-ends, two second-ends and two control-ends. The two second-ends of first differential pair 113 are coupled with each other and further coupled to a first-end of switch pair 115. The two second-ends of second differential pair 114 are coupled with each other and further coupled to the other first-end of switch pair 115. In other words, the first-ends of switch pair 115 are coupled to first differential pair 113 (the second-end thereof), and second differential pair 114 (the second-end thereof), respectively. The two second-ends of switch pair 115 are coupled with each other.

The second-ends of switch pair 115 are coupled to current source 116/117. In some embodiments, current source may include at least a current source 116 and a current generating circuit 117.

Here, switch pairs 115 correspond to current sources 116, respectively. Each current source 116 has two first-ends. The two second-ends of switch pairs 115 are coupled with each other and further coupled to a first-end of corresponding current source 116. The other first end of current source 116 is coupled to current generating circuit 117.

The two control-ends of first differential pair 113 receive first input clocks CK1 and CK1b in differential form (i.e., differential signals), respectively. In other words, a pair of the first input clocks CK1 and CK1b in differential form includes two complementary single-ended clocks, and the two single-ended clocks are respectively inputted into the two control-ends of first differential pair 113.

The two control-ends of second differential pair 114 receive second input clocks CK2 and CK2b in differential form (i.e., differential signals), respectively. In other words, the second input clocks CK2 and CK2b in differential form includes two complementary single-ended clocks, and the two single-ended clocks are respectively inputted into the two control-ends of second differential pair 114.

Assuming the input clocks c1 ad c2 are single-ended signals, the first input clocks CK1 and CK1b in differential form are obtained by converting the input clock c1 from single-ended form into differential form, and the second input clocks CK2 and CK2b in differential form are obtained by converting the input clock c2 from single-ended form into differential form.

In some embodiments, single-ended to differential converter is used to convert the single-ended signal into differential signals.

In some embodiments, the input clock c1 may be directly applied as the first input clock CK1; meanwhile an inverter reverses the input clock c1 to obtain first input clock CK1b. Similarly, the input clock c2 can be directly applied as the second input clock CK2; meanwhile an inverter reverses the input clock c2 to obtain the second input clock CK2b.

Here, the first input clocks CK1 and CK1b and the second input clocks CK2 and CK2b, and the first input clocks CK1 and CK1b lead the second input clocks CK2 and CK2b.

The two control-ends of switch pair 115 are used to receive control signals CS<m:0> and CSb<m:0> in differential form (i.e., differential signals), respectively. Similarly, the control signals CS<m:0> and CSb<m:0> in differential form also can be obtained by converting a single-ended signal.

The first input clocks CK1 and CK1b are inputted into the two control-ends of first differential pair 113 in operation, respectively. The second input clocks CK2 and CK2b are inputted into the two control-ends of second differential pair 114, respectively. The control signals CS<m:0> and CSb<m:0> are inputted into the two control-ends of switch pair 115, respectively.

Current source 116 receives a reference current Ia generated by current generating circuit 117, and maps the reference current Ia to generate an input current Ib. Here, the reference current Ia is proportional to the frequency of the first input clocks CK1 and CK1b and the second input clocks CK2 and CK2b.

The input current Ib are divided into a first current Ib1 and a second current Ib2 through switch pair 115. Here, the first current Ib1 is used to bias first differential pair 113, the second current Ib2 is used to bias second differential pair 114, so as to generate a first signal OP and a second signal ON on first stage.

Switch pairs 115 generate the input current Ib to bias first differential pairs 113 and second differential pairs 114 according to the control signals CS<m:0> and CSb<m:0>, namely switch pairs regulate the bias currents providing to first differential pairs 113 and second differential pairs 114 according to the control signals CS<m:0> and CSb<m:0>. In other words, current source generates the input currents Ib to switch pairs 115, then switch pairs 115 regulate the bias currents outputting to first differential pairs 113 and second differential pairs 114 according to the control signals CS<m:0> and CSb<m:0>.

Figure 8:
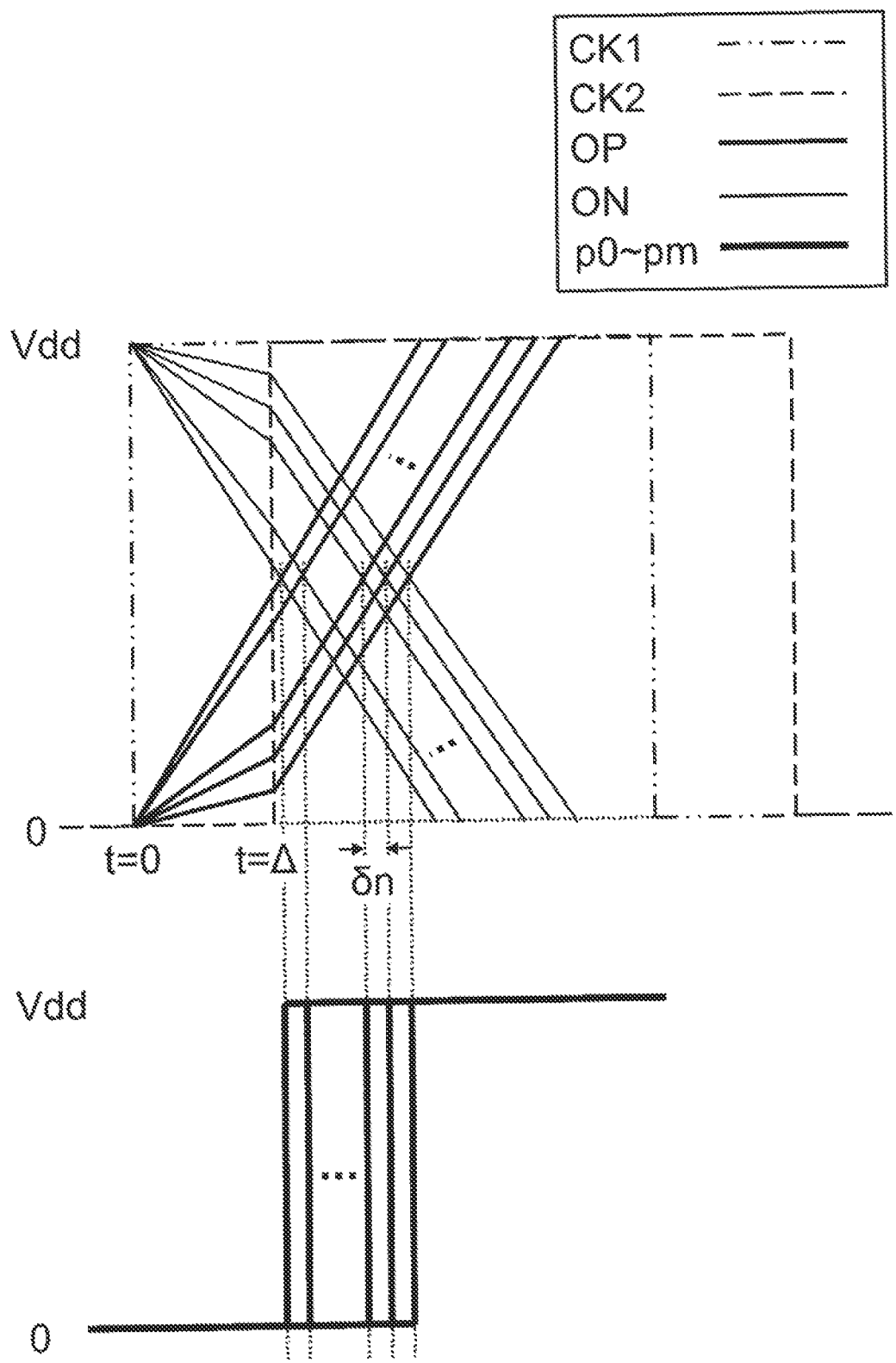
FIG. 8 is a working schematic diagram of phase interpolator as shown in FIG. 7.

FIG. 8 is a working schematic diagram of phase interpolator 110 as shown in FIG. 7. In FIG. 8, the first input CK1, the second clock CK2, the first signal OP and the second signal ON are shown at the top, the output clock signals p0·pm are shown on the bottom.

Please refer to FIG. 8, in which the first input clocks CK1 and CK2 are varied from 0V to Vdd between time t=0 and t=Δ, respectively. The solid lines (thick), illustrate the waveform rising from 0V to Vdd of the first signals OP corresponding to the output clock signals p0~pm, respectively. The solid lines (thin), illustrate the waveform fling from Vdd to 0V of the second signals ON corresponding to the output clock signals p0~pm, respectively. Before time t=Δ, the slope of the first signals OP corresponding to the output clock signals p0~pm are mk~k. After time t=Δ, the slope of the first signals OP corresponding to the output clock signals p0~pm are mk. Before time t=Δ, the slope of the second signals ON corresponding to the output clock signals p0~pm are −mk~−k. After time t=Δ, the slope of the second signals ON corresponding to the output clock signals p0~pm are −mk.

In some embodiments, the control signals CS<m:0> and CSb<m:0> have a number of bits corresponding to the amount of the output clock signals po~pm. In multi-phase interpolation device 100 which generates m+1 output clock signals p0~pm, when the control signals CS<m:0> and CSb<m:0> received by the nth phase interpolator generating the output clock signal pn have n bits with high level, for example, logic "1". In other words, the slopes of the first signal OP and the second signal ON can be chosen through controlling the amount of switch pairs 115 which are turned on. In multi-phase interpolation device 100 generating m+1 output clock signals p0~pm, the slopes of the first signal OP and the second signal ON are determined by controlling the amount of switch pairs which are turned on, namely the slope of the first signals OP is determined between mk~k, the slope of the second signals ON is determined between −mk~−k.

For example, in the nth phase interpolator generating the output clock signal pn, n switch-pairs 115 are selected to turn on, so that the slope of the first signal OP is nk as well as the slope of the second signal ON is −nk.

In some embodiments, the control signals CS<m:0> and CSb<m:0> may be thermal code or binary code.

Subsequently, the first signal OP and the second signal ON are converted into the output clock signal pn in single-ended form by differential to single-ended converter 111.

Here, when the first signal OP is higher than the second signal ON, differential to single-ended converter 111 outputs logic "0" (the output clock signal pn). When the first signal OP is lower than the second signal ON, differential to single-ended converter 111 outputs logic "1" (the output clock signal pn).

In addition, the intersection of the first output clock signal OP and the second output clock signal ON is in the overlap duration between the first input clock CK1/CK1b and the second input clock CK2/CK2b through regulating at least either the load of load circuit 112 or the reference current Ia. That is, the rising speed of the first signal OP and the falling speed of the second signal ON are determined through regulating the load of load circuit 112 and/or the reference current Ia.

For example, when frequency is decreased, the spacing between two input clocks will be increased, meanwhile the slopes of the first signal OP is decreased and the second signal ON is increased by reducing the reference current Ia in multiples (to keep the reference current Ia to be proportional to the frequency of the input clock), so as to reduce the slope of the first signal OP and to increase the slope of the second signal ON, so that the intersection of the first output clock signal OP and the second output clock signal ON is maintained in the overlap duration of two input clocks.

When frequency is increased, the spacing between two input clocks will be decreased; meanwhile the slopes of the first signal OP is increased and the second signal ON is decreased through increasing the reference current Ia in multiples (to keep the reference current Ia to be proportional to the frequency of the input clock), so as to increase the slope of the first signal OP and to decrease the slope of the second signal ON, so that the intersection of the first output clock signal OP and the second output clock signal ON is maintained in the overlap duration of two input clocks.

In other words, the slope of the first signal OP and that of the second signal ON are proportional to the frequency of the input clock. As a result, a phase interpolator can operate in a wide frequency range.

In some embodiments, the overlap duration between the first input clock CK1/CK1b and the second input clock CK2/CK2b is longer than the time duration that the first input clock CK1/CK1b leads the second input clock CK2/CK2b, so that the intersection between the first signal OP and the second signal ON can be easily maintained in the overlap duration between the first input clock CK1/CK1b and the second input clock CK2/CK2b.

For the first input clock CK1/CK1b and the second input clock CK2/CK2b which have 50% duty cycle, the phase difference between the first input clock CK1/CK1b and the second input clock CK2/CK2b is preferably less than 90°, so that uniform multi-phase output clock signals can be easily interpolated.

In some embodiments, referring to FIG. 7, load circuit 112 includes a pair of load capacitors, hereinafter named respectively as first capacitor $C1_{load}$ and second capacitor $C2_{load}$, for the convenience of description.

First capacitor $C1_{load}$ is coupled between a voltage-source point VDD and a first-end of first differential pair 113, and second capacitor $C2_{load}$ is coupled between the voltage-source point VDD and the other first-end of first differential pair 113.

Choosing appropriate capacitance of load capacitors ($C1_{load}$ and $C2_{load}$), allows the intersection of the first signal OP and the second signal ON to be in the overlap duration between the first input clock CK1/CK1b and the second input clock CK2/CK2b.

The voltage-source point VDD is electrically connected to a voltage source and provides a voltage level (Vdd).

Here, load circuit 112 further includes two transistors, hereinafter named respectively as first transistor MLa and second transistor MLb, for the convenience of description.

A first-end of first transistor MLa is coupled between the voltage-source point VDD and an end of first capacitor $C1_{load}$. A second-end of first transistor MLa is coupled to the other end of first capacitor $C1_{load}$, a control-end of first transistor MLa and the point N1. In other words, first capacitor $C1_{load}$ is connected between the control-end of first transistor MLa and the second-end of first transistor MLa.

A first-end of second transistor MLb is coupled between the voltage-source point VDD and an end of second capacitor $C2_{load}$. A second-end of second transistor MLb is coupled to the other end of second capacitor $C2_{load}$, a control-end of second transistor MLb and the point N1. In other words, second capacitor $C2_{load}$ is connected between the control-end of second transistor MLb and the second-end of second transistor MLb.

In some embodiments, the two transistors of load circuit 112 may be implemented by PMOS (P-type metal-oxide-semiconductor), transistors.

In some embodiments, referring to FIG. 7, first differential pair 113 includes two transistors, hereinafter named respectively as first transistor M1a and second transistor M1b, for the convenience of description.

A first-end of first transistor M1a is coupled to the point N1, and a first-end of second transistor M1b is coupled to the point N2.

In other words, the first-end of first transistor M1a is coupled to an input-end of differential to single-ended converter 111, the first-end of second transistor M1b is coupled to the other input-end of differential to single-ended converter 111.

A second-end of first transistor M1a and a second-end of second transistor M1b are coupled with each other, and the second-end of first transistor M1a and the second-end of second transistor M1b are both coupled to one of the two first-ends of each switch pair 115.

A control-end of first transistor M1a receives the first input clock CK1, and a control-end of second transistor M2a receives the first input clock CK1b.

In some embodiments, the two transistors of first differential pair 113 may be implemented by NMOS (N-type metal-oxide-semiconductor), transistors.

In some embodiments, referring to FIG. 7, second differential pair 114 includes two transistors, hereinafter names respectively as first transistor M2a and second transistor M2b, for the convenience of description.

A first-end of first transistor M2a is coupled to the point N1, and a first end of second transistor M2b is coupled to the point N2.

In other words, the first-end of first transistor M2a is coupled to an input-end of differential to single-ended converter 111, and the first-end of second transistor M2b is coupled to the other input-end of differential to single-ended converter 111.

A second-end of first transistor M2a and a second-end of second transistor M2b are coupled with each other, in addition, similar to the first differential pair 113, the second-end of first transistor M2a and the second-end of second transistor M2b are both coupled to the other one of the two first-ends of each switch pair 115.

A control-end of first transistor M2a receives the second input clock CK2, and a control-end of second transistor M2b receives the second input clock CK2b.

In some embodiments, the two transistors of second differential pair 114 may be implemented by NMOS (N-type metal-oxide-semiconductor), transistors.

In some embodiments, referring to FIG. 7, each switch pair 115 includes two switches, hereinafter named respectively first switches Mswa<m:0> and second switches Mswb<m:0>, for the convenience of description.

Each first-end of first switches Mswa<m:0> connects to the second-end of first differential pair 113 (the second-end of two transistors of first differential pair 113), and each first-end of second switches Mswb<m:0> connects to the second-end of second differential pair 114 (the second-end of two transistors of second differential pair 114).

Each second-end of first switches Mswa<m:0> and each second-end of second switches Mswa<m:0> are coupled with each other. In addition, each second-end of first switches Mswa<m:0> and each second-end of second switches Mswa<m:0> are both coupled to current source 116 for receiving the input current Ib from current source 116.

Each control-end of first switches Mswa<m:0> receives the control signals CS<m:0>, each control-end of second switches Mswb<m:0> receives the control signals CSb<m:0>.

Here, first switches Mswa<m:0> and second switches Mswb<m:0> provide a bias state of first differential pair 113 and a bias state of second differential pair 114, respectively.

In some embodiments, when the control signals CS<m:0> are pulled up to high level, the control signals CSb<m:0> are pulled down to low level. Meanwhile, first switch Mswa will be turned off because of the control signals CSb<m:0>, and second switch Mswb will be turned on because of the control signals CSb<m:0>, so that the second current Ib2 is equal to the input current Ib. In other words, when the control signals CS<m:0> are pulled up to high level, second differential pair 114 is biased by the second current Ib2, but no current biases first differential pair 113. Meanwhile, among different phase interpolators 110, the value of the second current Ib2 can be determined according to the amount of operated switch pairs 115.

When the control signals CS<m:0> are pulled down to low level, the control signals CSb<m:0> are pulled up to high level. Meanwhile, first switch Mswa is turned on because of the control signals CSb<m:0>, second switch Mswb is turned off because of the control signals, so that the first current Ib1 is equal to the input current Ib. In other words, when the control signals CSb<m:0> are pulled up to high level, first differential pair 113 is biased by the first current Ib1, but no current biases second differential pair 114. Meanwhile, among different phase interpolators 110, the value of the first current Ib1 can be determined according to the amount of operated switch pairs 115.

In some embodiments, two switches of each switch pair 115 may be implemented by transistors, wherein these transistors may be NMOS (N-type metal-oxide-semiconductor), transistors.

In some embodiments, referring to FIG. 7, each current source 116 may be a current mirror. In other words, each current source 116 includes two transistors, hereinafter named respectively first transistor Mcma<m:0> and second transistor Mcmb, for the convenience of description. Switch pairs 115 correspond to first transistors Mcma<m:0> of current source 116, respectively.

Each first-end of first transistors Mcma<m:0> is coupled to second-ends of corresponding switch pairs 115 (the second-end of first switch Mswa<m:0> and the second-end of second switch Mswb<m:0>), and each second-end of first transistor Mcma<m:0> is coupled to a ground point VSS. The ground point VSS is electrically connected to system ground.

A first-end of second transistor Mcmb is coupled to an output-end of current generating circuit 117 for receiving the reference current Ia generated by current generating circuit 117. A second-end of second transistor Mcmb is coupled to the ground point VSS.

The first-end of second transistor Mcmb is coupled to a control-end of second transistor Mcmb, and the control-end of second transistor Mcmb and a control-end of first transistors Mcma<m:0> are coupled with each other.

In some embodiments, two transistors of each current source 116 may be implemented by NMOS transistors.

Figure 9:
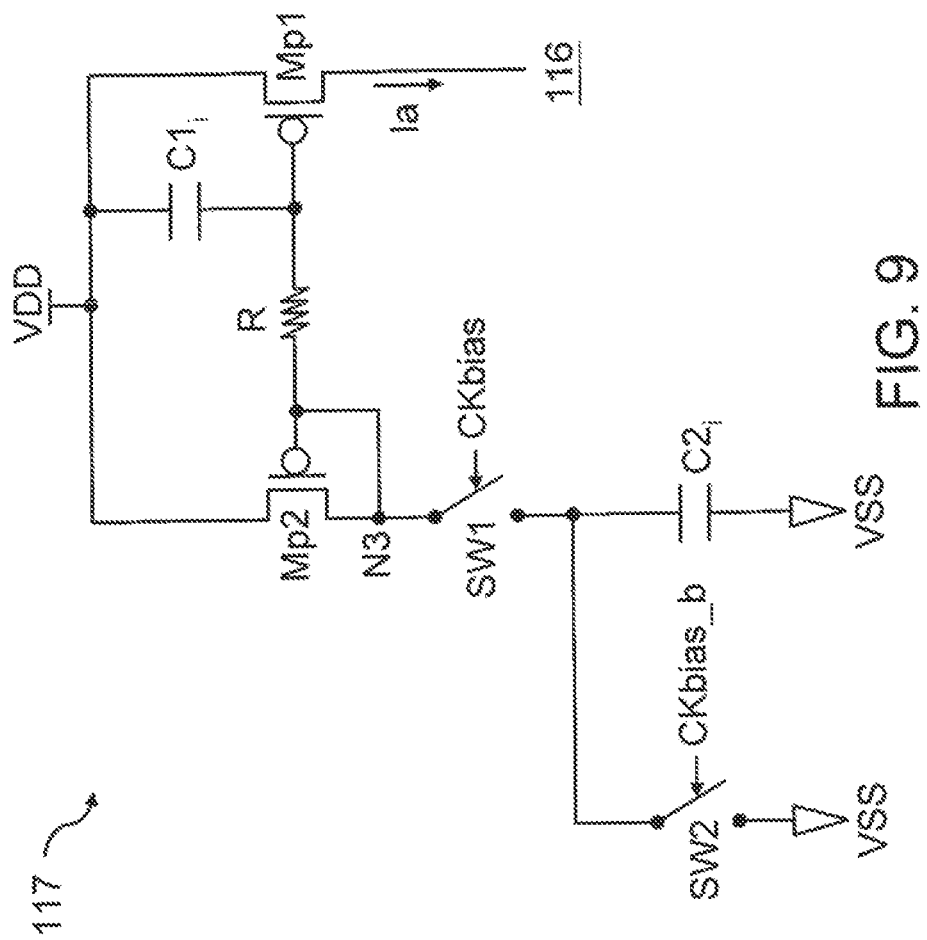
FIG. 9 is a schematic diagram of current generating circuit according to an embodiment.

In some embodiments, referring to FIG. 9, current generating circuit 117 includes two transistors (hereinafter named respectively as first transistor Mp1 and second transistor Mp2, for convenience of description), two capacitors (hereinter named respectively as first capacitor $C1_i$ and second capacitor $C2_i$, for convenience of description), a resistor R and two switches (hereinafter named respectively as first switch SW1 and second switch SW2, for convenience of description).

A fist-end of first transistor Mp1 is coupled to the voltage source point VDD, and a second-end of first transistor Mp1 is coupled to each current source 116 (the first-end of second transistor Mcmb).

A first-end of second transistor Mp2 is coupled to the voltage source point VDD, a second-end of second transistor Mp2 is coupled to a control-end of second transistor Mp2.

First capacitor $C1_i$ connects between the first-end of first transistor Mp1 and a control-end of first transistor Mp1. In other words, a first-end of first capacitor $C1_i$ is coupled to the voltage source point VDD and the first-end of first transistor Mp1, and a second-end of first capacitor $C1_i$ is coupled to the control-end of first transistor Mp1.

Resistor R is coupled between the control-end of first transistor Mp1 and the control-end of second transistor Mp2. In other words, a first-end of resistor R and the second-end of first capacitor $C1_i$ are both coupled to the control-end of first transistor Mp1, and a second-end of resistor R is coupled to the control-end of second transistor Mp2.

A first-end of first switch SW1 is coupled to the second-end of second transistor Mp2, and a second-end of first switch SW1 is coupled to second capacitor $C2_i$ and second switch SW2. In other words, first switch SW1 is coupled between the second-end of second transistor Mp2 and second capacitor $C2_i$, as well as coupled between the second-end of second transistor Mp2 and second switch SW2.

Second capacitor $C2_i$ is coupled between the second-end of first switch SW1 and the ground point VSS, and second switch SW2 is connected across second capacitor $C2_i$. In other words, a first-end of second switch SW2 and a first-end of second capacitor $C2_i$ are both coupled to the second-end of first switch SW1, and a second-end of second switch SW2 and a second-end of second capacitor $C2_i$ are both coupled to the ground point VSS.

Here, a control-end of first switch SW1 and a control-end of second switch SW2 receive bias clocks CKbias and CKbiasb, respectively.

The bias clocks CKbias and CKbiasb are proportional to the first input clocks CK1/CK1b (as well as the second input clock CK2/CK2b).

The bias clocks CKbias and CKbiasb include two complementary single-ended clocks, and the two single-ended clocks are respectively inputted into the control-end of first switch SW1 and the control-end of second switch SW2 to control the operation of first switch SW1 and second switch SW2.

The electrical relation of the circuit is shown as following Formula 1 and Formula 2.

$$Req = 1/(2\pi \times C \times F_{CKbias}) \quad \text{Formula 1}$$

$$Ia = (Vdd - Vgs)/Req = 2\pi \times C \times F_{CKbias} \times (Vdd - Vgs) \quad \text{Formula 2}$$

Req represents equivalent resistance between the ground point VSS and a point N3 which connects with the second-end of second transistor Mp2 and the first-end of first switch SW1. C represents a capacitance of second capacitor $C2_i$. $F_{CKbias}$ represents the frequency of the bias clock CKbias. Vdd represents the voltage of voltage source point. Vgs represents a voltage difference between the second-end of second transistor Mp2 and the control-end of second transistor Mp2.

It can be realized that the reference current Ia is proportional to $F_{CKbias}$ according to Formula 1 and Formula 2.

As a result, through regulating the value of reference current Ia, the intersection of the first output clock signal OP and the second output clock signal ON is in the overlap duration between the first input clock CK1/CK1b and the second input clock CK2/CK2b, thus the phase of the interpolated output clock signals are uniform.

In some embodiments, two transistors of current generating circuit 117 may be implemented by PMOS transistors. The two switches of current generating circuit 117 may be implemented by transistors.

Figure 10:
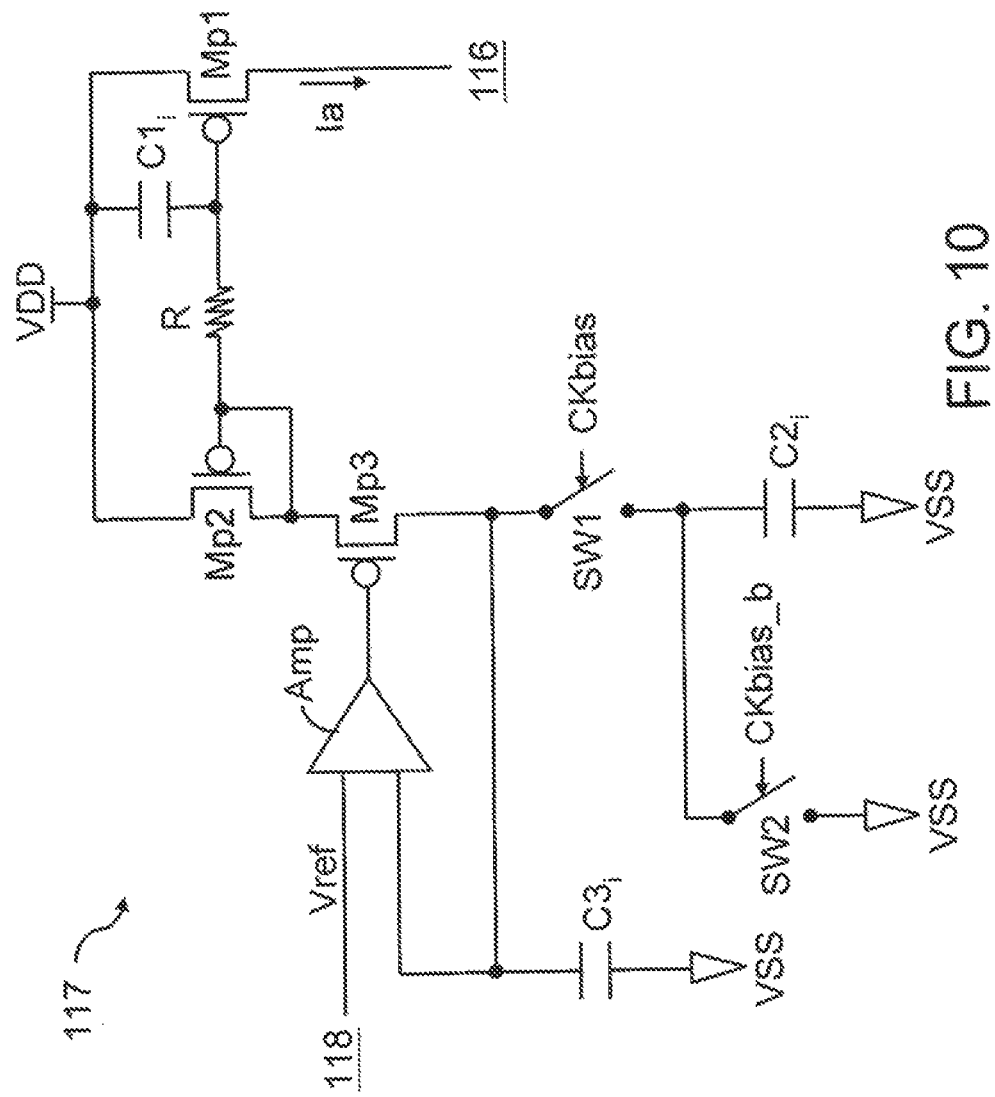
FIG. 10 is a schematic diagram of current generating circuit according to another embodiment.

In some embodiments, referring to FIG. 10, current generating circuit 117 includes three transistors (hereinafter named respectively as first transistor Mp1, second transistor Mp2 and third transistor Mp3, for convenience of description), three capacitors (hereinafter named respectively as first capacitor $C1_i$, second capacitor $C2_i$ and third capacitor $C3_i$, for convenience of description), a resistor R, two switches (hereinafter named respectively as first switch SW1 and second switch SW2, for convenience of description) and a operational amplifier Amp. Current source further includes bandgap voltage circuit 118.

A first-end of first transistor Mp1 is coupled to the voltage source point VDD, and a second-end of first transistor Mp1 is coupled to each current source 116 (the first-end of second transistor Mcmb).

A first-end of second transistor Mp2 is coupled to the voltage source point VDD, and a second-end of second transistor Mp2 is coupled to a control-end of second transistor Mp2.

First capacitor $C1_i$ connects between the first-end of first transistor Mp1 and a control-end of first transistor Mp1. In other words, a first-end of first capacitor $C1_i$ is coupled to the voltage source point VDD and the first-end of first transistor Mp1, and a second-end of first capacitor $C1_i$ is coupled to the control-end of first transistor Mp1.

Resistor R is coupled between the control-end of first transistor Mp1 and the control-end of second transistor Mp2. In other words, a first-end of resistor R and the second-end of first capacitor $C1_i$ are both coupled to the control-end of first transistor Mp1, and a second-end of resistor R is coupled to the control-end of second transistor Mp2.

A first-end of third transistor Mp3 is coupled to the second-end of second transistor Mp2, and a second-end of third transistor Mp3 is coupled to a first-end of first switch SW1.

A control-end of third transistor Mp3 is coupled to an output-end of operational amplifier Amp, so that the operation of third transistor Mp3 (i.e., turned an or turned off), can be controlled by the output of operational amplifier Amp.

A first input-end of operational amplifier Amp is coupled to bandgap voltage circuit 118. Since the implementation structure and operation principle of bandgap voltage circuit 118 is well-known, it will not be described further. Here, bandgap voltage circuit 118 provides a reference voltage Vref which does not vary with the variation of temperature and that of voltage.

A second input-end of operational amplifier Amp is coupled to the second-end of third transistor Mp3, the first-end of first switch SW1 and a first-end of third capacitor $C3_i$. Here, the voltage value of the second-end of third transistor Mp3 is equal to the input of the first input-end of operational amplifier Amp (i.e., the reference voltage Vref).

A second-end of third capacitor $C3_i$ is coupled to the ground point VSS. In other words, third capacitor $C3_i$ is coupled between the second input-end of operational amplifier Amp and the ground point VSS, as well as coupled between the second-end of third transistor Mp3 and the ground point VSS.

The first-end of first switch SW1 is coupled to the second-end of third transistor Mp3, the second input-end of operational amplifier Amp and the first-end of third capacitor $C3_i$, and a second-end of first switch SW is coupled to second capacitor $C2_i$ and second switch SW2. In other words, first switch SW1 is coupled between the second-end of second transistor Mp2 and second capacitor $C2_i$, as well as coupled between the second-end of second transistor Mp2 and second switch SW2.

Second capacitor $C2_i$ is coupled between the second-end of first switch SW1 and the ground point VSS, and second switch SW2 is connected across second capacitor $C2_i$. In other words, a first-end of second switch SW2 and a first-end of second capacitor $C2_i$ are both coupled to the second-end of first switch SW1, and a second-end of second switch SW2 and a second-end of second capacitor $C2_i$ are both coupled to the ground point VSS.

Here, a control-end of first switch SW1 and a control-end of second switch SW2 receive the bias clocks CKbias and CKbiasb in differential form, respectively.

The bias clocks CKbias and CKbiasb are proportional to the first input clocks CK1/CK1b (as well as the second input clock CK2/CK2b).

The bias clocks CKbias and CKbiasb include two complementary single-ended clocks, the two single-ended clocks are respectively inputted into the control-end of first switch SW1 and the control-end of second switch SW2 to control the operation of first switch SW1 and second switch SW2.

Bandgap voltage circuit 118 generates the reference voltage Vref, and the reference voltage Vref is inputted into the first input-end of operational amplifier Amp.

The electrical relation of the circuit is shown as following Formula 3.

$$Ia = Vref \times C \times F_{CKbias} \quad \text{Formula 3}$$

C represents a capacitance of second capacitor $C2_i$. $F_{CKbias}$ represents the frequency of the bias clock CKbias.

It can be realized that the reference current Ia is proportional to the frequency $F_{CKbias}$ of the bias clock $F_{CKbias}$ according to Formula 3, and the variation of the reference voltage Vref will cause the reference current Ia to be varied. Since the reference voltage Vref generated by bandgap voltage circuit 118 is unrelated to process, temperature and power voltage, the reference current Ia is unrelated to process and temperature.

As a result, through regulating the value of reference current Ia, the intersection of the first output clock signal OP and the second output clock signal ON is in the overlap duration between the first input clock CK1/CK1b and the second input clock CK2/CK2b, thus the phase of the interpolated output clock signals pn are uniform.

In some embodiments, three transistors of current generating circuit 117 may be implemented by PMOS transistors. The two switches of current generating circuit 117 may be implemented by transistors.

Figure 11:
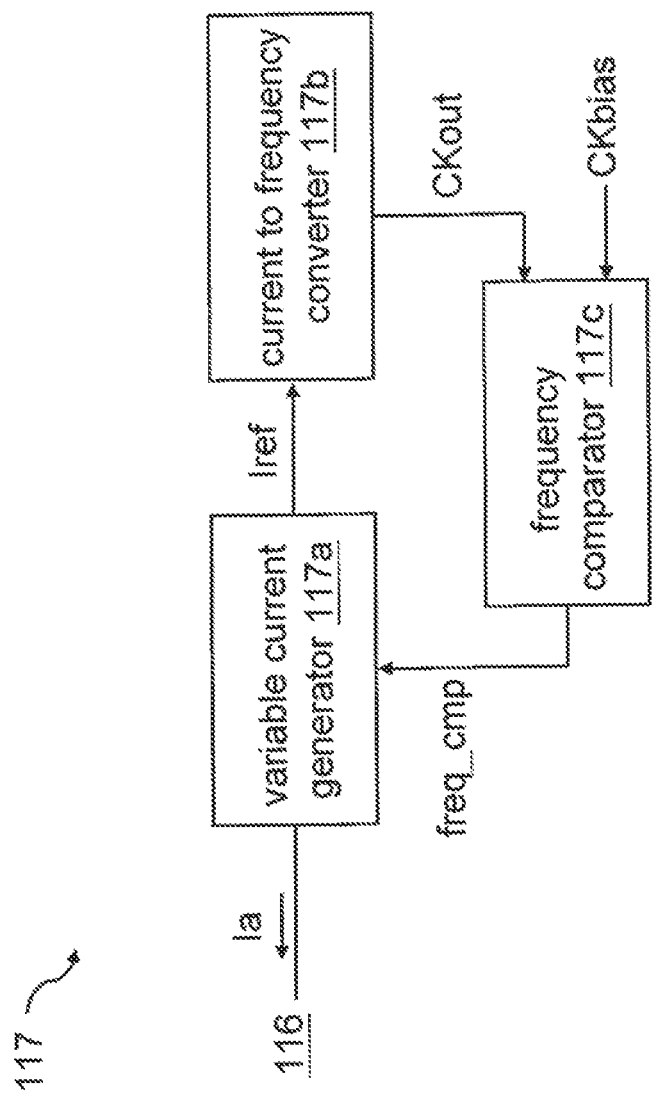
FIG. 11 is a schematic diagram of current generating circuit according to the other embodiment.

In some embodiments, referring to FIG. 11, current generating circuit 117 includes variable current generator 117a, current to frequency converter 117b and frequency comparator 117c.

Variable current generator 117a, current to frequency converter 117b and frequency comparator 117c are cascaded in sequence to form a loop. In other words, current to frequency converter 117b is coupled between variable current generator 117a and frequency comparator 117c, and frequency comparator 117c has a feedback route to couple with variable current generator 117a.

Variable current generator 117A further connects to current source 116 (the first-end of second transistor Mcmb).

Variable current generator 117a generates a feedback current Iref to current to frequency converter 117b, and maps the feedback current Iref to generate the reference current Ia to current source 116.

Current to frequency converter 117b receives the feedback current Iref and generates a clock signal CKout according to the feedback current Iref. The frequency of the clock signal CKout is proportional to the feedback current Iref.

Frequency comparator 117c receives the clock signal CKout and the bias clock CKbias, and compares the frequency of the clock signal with that of the bias clock to generate a comparison result freq_cmp.

The bias clock CKbias is proportional to the first input clock CK1/CK1b (as well as the second input clock CK2/CK2b). The bias clock CKbias can be a single-ended signal.

The comparison result freq_cmp from frequency comparator 117 is feedbacked to variable current generator 117a, and variable current generator 117a regulates the value of the feedback current Iref generated thereof according to the comparison result freq_cmp, so that the frequency of the clock signal CKout and that of the bias clock CKbias finally can be the same. Meanwhile, the feedback current Iref is proportional to the frequency of the bias clock CKbias. The reference current Ia is generated by mapping the feedback current Iref, so the reference current Ia is proportional to the frequency of the bias clock CKbias, i.e., be proportional to the first input clock CK1/CK1b (as well as the second input clock CK2/CK2b). In addition, the reference current Ia is unrelated to process and temperature.

As a result, through regulating the value of the reference current Ia, the intersection of the first output clock signal OP and the second output clock signal ON is in the overlap duration between the first input clock CK1/CK1b and the second input clock CK2/CK2b, thus the phase of the interpolated output clock signals are uniform.

Accordingly, a phase interpolator, multi-phase interpolation device, interpolated clock generating method and multi-phase clock generating method, use a switch pair to control the bias state of two differential pairs sharing load circuit according to the current source, and regulates the load of load circuit and/or the reference current, and thereby the intersection of the first signal and the second signal is in the overlap duration between the first output clock signal and the second output clock signal, so that uniform multi-phase output clock signals can be interpolated without being affected by process and temperature.

While the present invention has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A phase interpolator, comprising:
   a differential to single-ended converter, having two input-ends to receive a differential signal comprising a first signal and a second signal, respectively, and converting the differential signal into an output clock signal in single-ended form;
   a load circuit, coupled to the input-ends of the differential to single-ended converter;
   a first differential pair, coupled to the input-ends of the differential to single-ended converter, wherein a control-end of the first differential pair receives a first input clock;
   a second differential pair, coupled to the input-ends of the differential to single-ended converter, wherein a control-end of the second differential pair receives a second input clock;
   a current source, generating a reference current, wherein the reference current is proportional to the frequency of the first input clock; and
   a switch pair, coupled between the first and the second differential pairs and the current source, wherein a control-end of the switch pair receives a control signal in differential form.

2. The phase interpolator of claim 1, wherein the current source comprises:
   a frequency comparator, comparing the frequency of a clock signal with that of a bias clock to generate a comparison result;
   a variable current generator, coupled to the frequency comparator to generate a feedback current according to the comparison result and to map the feedback current to generate the reference current; and
   a current to frequency converter, coupled to the variable current generator and the frequency comparator to generate the clock signal according to the feedback current.

3. The phase interpolator of claim 1, wherein the current source further comprises a bandgap voltage circuit.

4. The phase interpolator of claim 1, wherein the load circuit comprises:
   a first transistor, a first capacitor, a second transistor, and a second capacitor.

5. The phase interpolator of claim 1, wherein the overlap duration between the first input clock and the second input clock is longer than the time duration that the first input clock leads the second input clock.

6. The phase interpolator of claim 1, wherein the phase difference between the first input clock and the second input clock is less than 90°.

7. The phase interpolator of claim 1, wherein the first input clock leads the second input clock, and the intersection of the first signal and the second signal is in the overlap duration between the first input clock and the second input clock.

8. A multi-phase interpolation device, comprising a plurality of the phase interpolators, each phase interpolator corresponding to the phase interpolator of claim 1, wherein the output clock signals from the phase interpolators have equal spacing.

9. An interpolated clock generating method, comprising:
using two differential pairs sharing a load circuit to respectively receive a first input clock and a second clock;
receiving a reference current, wherein the value of the reference current is proportional to the frequency of the first input clock;
generating at least an input current according to the reference current;
providing the at least an input current to bias the differential pairs according to a control signal to generate a first signal and a second signal;
regulating at least the load of the load circuit or the reference current to allow the intersection of the first signal and the second signal to be in the overlap duration between the first input clock and the second input clock; and
converting the first signal and the second signal into an output clock signal.

10. The method of claim 9, wherein the overlap duration between the first input clock and the second input clock is longer than the time duration that the first input clock leads the second input clock.

11. The method of claim 9, wherein the phase difference between the first input clock and the second input clock is less than 90°.

12. The method of claim 9, wherein the step of regulating the load of the load circuit comprises:
regulating the capacitance of a pair of load capacitors in the load circuit.

13. The method of claim 9, wherein the step of regulating the reference current comprises:
comparing the frequency of a clock signal with that of a bias clock to generate a comparison result, wherein the bias clock corresponds to the first input clock;
regulating and outputting a feedback current according to the comparison result;
producing the reference current by mapping feedback current; and
converting the feedback current into the clock signal having the same frequency with the feedback current.

14. The method of claim 9, wherein the step of regulating the reference current comprises:
receiving a reference voltage from a bandgap voltage circuit; and
using a current source to generate a reference current according to a bias clock and the reference voltage, wherein the bias clock corresponds to the first input clock, and the reference current corresponds to the frequency of the bias clock.

* * * * *